United States Patent

[11] 3,624,556

[72] Inventor John Alexander Copeland, III
Gillette, N.J.

[21] Appl. No. 50,567
[22] Filed June 29, 1970
[45] Patented Nov. 30, 1971

[73] Assignee Bell Telephone Laboratories, Incorporated
Murray Hill, Berkeley Heights, N.J.

[54] BULK-EFFECT SEMICONDUCTOR DEVICES
4 Claims, 2 Drawing Figs.

[52] U.S. Cl. .......... 331/107 G, 317/234 V, 330/5
[51] Int. Cl. .......... H03b 7/00
[50] Field of Search .......... 331/107 G; 330/5; 317/234 V

*Primary Examiner*—Roy Lake
*Assistant Examiner*—Darwin R. Hostetter
*Attorneys*—R. J. Guenther and Arthur J. Torsiglieri

ABSTRACT: Traveling electric field domains are suppressed in a bulk-effect negative resistance device by including on the semiconductor wafer a plurality of dielectric stripes extending between the cathode and the anode contacts. The stripes tend to break up any incipient domains by reducing the localized velocity of the domain in the wafer region immediately contiguous to the stripe.

PATENTED NOV 30 1971 3,624,556

INVENTOR
J. A. COPELAND III
BY
ATTORNEY

BULK-EFFECT SEMICONDUCTOR DEVICES

BACKGROUND OF THE INVENTION

This invention relates to microwave frequency amplifiers and oscillators using bulk-effect negative resistance diodes.

The structure and operation of a family of semiconductor devices known variously as bulk-effect devices, two-valley devices, and Gunn-effect diodes, are described, for example, in a series of papers in the Jan. 1966 issue of *IEEE Transactions on Electron Devices*, Vol. ED–13, No. 1. As set forth in these papers, high-frequency oscillations can be obtained by applying an appropriate direct current voltage across a suitable bulk semiconductor wafer having no discernable *p–n* rectifying junctions. These oscillations result from the formation of discrete regions of high electric field intensity and corresponding space-charge accumulation, called domains, that travel from the negative to the positive contact at approximately the carrier drift velocity. The bulk material presents a differential negative resistance to internal currents in the domain, causing the electric field intensity of the domain to grow as it travels toward the positive electrode.

The formation and propagation of traveling domains places certain frequency and power limitations on the oscillator output and also prevents the device from being used as an amplifier. The copending application of J. A. Copeland III, Ser. No. 564,081, filed July 11, 1966, and having a common assignee, describes a mode of oscillation known as the LSA mode (limited space-charge accumulation) that permits bulk negative resistance oscillations while precluding the formation of domains.

Another device which prevents the formation of domains is now known as the subcritically doped diode, and is described, for example, in the paper "Microwave Amplification in a GaAs Bulk Semiconductor" of the *IEEE Transactions* issue set forth above. This device is intended to function primarily as an amplifier, but it will work as intended only if the product of semiconductor length and carrier concentration is below some predetermined value. The main drawback of the subcritically doped diode is that, because of the semiconductor length and carrier concentration limitation, its power capabilities are limited.

The copending application of Bartelink et al., Ser. No. 795,849, filed Feb. 3, 1969, describes how traveling domains can further be suppressed by including coatings which form, with the wafer, metal-insulator-semiconductor (M-I-S) structures. These structures form "image" charges within the wafer which oppose the formation of the space-charge accumulations required for electric field domains.

SUMMARY OF THE INVENTION

It is an object of this invention to suppress the formation of traveling electric field domains in bulk semiconductor devices.

This and other objects of the invention are attained in an illustrative bulk-effect semiconductor diode which includes a plurality of dielectric stripes, each extending between the cathode and anode contacts of the diode. It can be shown that the velocity of any traveling domain must inherently be slower in any region immediately contiguous a dielectric stripe than in a region remote from a stripe. The stripes, which extend in the direction of domain propagation, therefore produce velocity differences along the length of any incipient domain that is being formed. This tends to break up the domain and prevents it from growing with distance. Such dielectric strips are, of course, particularly useful on either LSA diodes or subcritically doped diodes which require the suppression of traveling domains as a condition of proper operation.

These and other objects, advantages, and features of the invention will be better understood from a consideration of the following detailed description taken in conjunction with the accompanying drawing.

DRAWING DESCRIPTION

FIG. 1 is a schematic illustration of an oscillator circuit including an illustrative embodiment of the invention; and FIG. 2 is a top view of the diode used in the oscillator circuit of FIG. 1.

DETAILED DESCRIPTION

Figure 1:
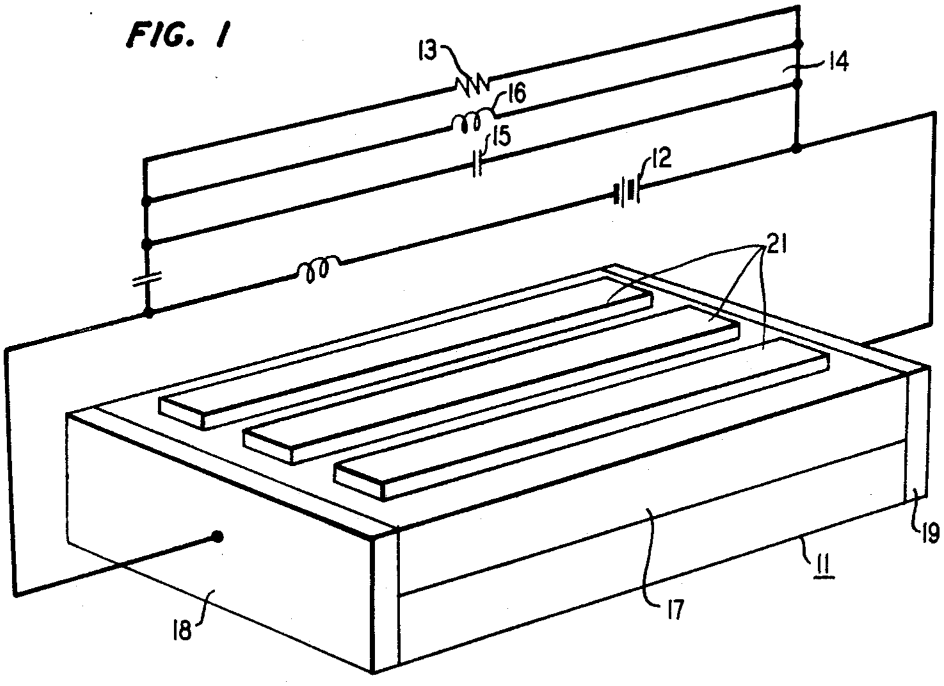

Referring now to FIG. 1, there is shown an oscillator circuit arrangement in accordance with an illustrative embodiment of the invention, which may be an LSA oscillator circuit comprising a bulk-effect diode 11, a DC voltage source 12, a load 13, and a resonant tank circuit 14 having a capacitance 15 and an inductance 16 in parallel with the load. The diode 11 comprises a sample 17 of semiconductor material such as *n*-type gallium arsenide included between substantially ohmic contacts 18 and 19. The sample 17 may be an epitaxial layer, of substantially uniform constituency, doped in a manner known in the art to give a differential negative resistance, as is characteristic of bulk-effect or two-valley semiconductors.

The external circuitry is designed in accordance with the principles of the aforementioned Copeland application to produce LSA mode oscillations. As such, the various parameters are adjusted to produce an electric field intensity within the diode that alternates between a high value at which negative resistance occurs, and a lower value at which the diode displays a positive resistance. By appropriately adjusting the duration of electric field excursions into the positive region of the diode, one can prevent the formation of the traveling domains responsible for Gunn-effect oscillations, while still obtaining the net negative resistance required for sustained oscillations. In addition to the Copeland application, LSA mode operation is described in the paper by J. A. Copeland III "A New Mode of Operation for Bulk Negative Resistance Oscillators," Proceedings of the IEEE, Oct. 1966, pages 1479–1480, and the patent of J. A. Copeland III 3,414,841, issued Dec. 3, 1968.

In spite of the proper design of the external circuitry, diodes intended to oscillate in the LSA mode may break into Gunn-effect oscillations through the spurious formation of traveling electric field domains. A frequent cause of such instability is spurious inhomogeneities in the diode sample. In accordance with the invention, traveling domains are further suppressed by including a plurality of dielectric stripes 21 on one surface of the diode sample. The stripes extend in the direction of electric field between the electrodes 18 and 19 and therefore in the direction of any possible traveling domain propagation. Their purpose is to break up any incipient domains by reducing the localized velocity of the immediately contiguous portions of the domain.

It is known that a traveling domain forms near the cathode contact and grows in intensity while traveling toward the anode contact due to a redistribution of charges within the sample. However, because charges redistribute much more slowly in a high dielectric, the velocity of any domain having fields extending into that dielectric is significantly lower than would be the case in the absence of the dielectric.

Figure 2:
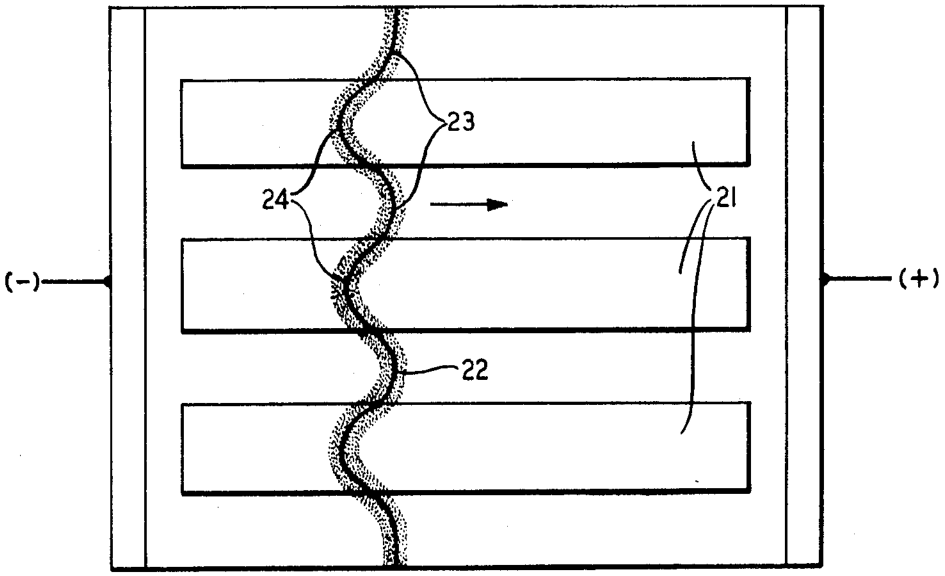

FIG. 2 illustrates how the resultant velocity differential caused by stripes 21 tends to break up any domain as it commences to grow in intensity.

Assuming that a domain 22 does form in spite of the LSA circuitry, portions 23 removed from the dielectric stripes 21 travel faster than do portions 24 immediately contiguous the stripes. Because of this differential velocity, regions of maximum intensity accompanying domain portions 23 are adjacent regions of minimum intensity accompanying domain portions 24. This causes space-charge current to flow transversely from regions 23 rather than flowing directly toward the anode. The transverse flow tends to attenuate and dissipate the domain before it can propagate a sufficient distance to grow to a high intensity. This natural tendency of the domain to become attenuated as it propagates further along the sample offsets the growth with respect to distance that would normally occur.

The invention may be used in an LSA diode, made in a known manner, from a 5-micron thick epitaxial layer of *n*-type gallium arsenide having a carrier concentration on the order of $5\times10^{15}$ centimeters$^{-2}$. The dielectric stripes may be barium titanate ($BaTiO_3$), 2-microns thick and on the order of 5-microns wide. The dielectric constant C of barium titanate is 12,000, which is suitably high with respect to the dielectric constant of gallium arsenide, which is only 12.8. The dielectric constant of a material is the ratio of the permittivity $\epsilon$ of that material to be permittivity $\epsilon_o$ of free space.

It can readily be appreciated that the use of dielectric stripes 21 significantly increases the flexibility of operation of LSA diode circuits and reduces the quality control requirements of the diodes. The same advantages apply to subcritically doped diodes in which the product of carrier concentration and sample length ($nL$) is maintained sufficiently small to inhibit domain formation. In gallium arsenide devices, the $nL$ product must typically be maintained below $10^{12}$ cm.$^{-2}$. The diode 11 of FIG. 1 may be considered to be representative of a subcritically doped diode used as an oscillation generator, in which case the external circuitry need not comply with the conditions of LSA operation to preclude domain formation. As is known, however, subcritically doped diodes may also be used as microwave amplifiers.

Gallium arsenide semiconductors are used for numerous other purposes, and it is believed that my invention would be useful wherever it is desired to inhibit or suppress domain formation that can occur through the application of a critically high electric field. Various other embodiments and modifications can be made by those skilled in the art without departing from the spirit and scope of the invention.

What is claimed is:

1. In apparatus of the type comprising a negative resistance device including a wafer of two-valley semiconductor material contained between anode and cathode contacts, said wafer exhibiting a differential negative resistance, an external circuit for taking advantage of such negative resistance, the improvement comprising:

means for suppressing the formation of traveling domains comprising a plurality of dielectric stripes on at least one surface of said wafer, said stripes each extending a major portion of the distance between said anode and cathode contacts;

each of said stripes having a significantly higher dielectric constant than the dielectric constant of said wafer, thereby to impart a slower velocity to the adjacent portion any incipient traveling electric field domain in the wafer and to suppress development of the domain.

2. The apparatus of claim 1 further comprising:

means comprising the external circuitry for causing the negative resistance device to generate LSA mode oscillations.

3. The apparatus of claim 1 wherein:

the device is a subcritically doped diode.

4. The apparatus of claim 2 wherein:

the wafer is of gallium arsenide and the stripes are of barium titanate.

* * * * *